United States Patent [19]
Wilhelm et al.

[11] Patent Number: 4,758,740
[45] Date of Patent: Jul. 19, 1988

[54] CIRCUIT FOR COMPENSATING THE TEMPERATURE DEPENDENCE OF GATE TRANSIT TIMES

[75] Inventors: Wilhelm Wilhelm; Peter Sehring, both of Munich, Fed. Rep. of Germany

[73] Assignee: Siemens Aktiengesellschaft, Berlin and Munich, Fed. Rep. of Germany

[21] Appl. No.: 913,410

[22] Filed: Sep. 29, 1986

[30] Foreign Application Priority Data

Sep. 27, 1985 [DE] Fed. Rep. of Germany ....... 3534561

[51] Int. Cl.⁴ ..................... H03K 3/26; H03K 19/086; H03K 5/13
[52] U.S. Cl. .................................. 307/310; 307/455; 307/608
[58] Field of Search ................ 307/455, 608, 591, 310

[56] References Cited

U.S. PATENT DOCUMENTS

| 3,515,998 | 6/1970 | Adams et al. | 307/442 |
| 3,746,890 | 7/1973 | Walker | 307/599 |
| 3,769,528 | 10/1973 | Chu et al. | 307/270 |
| 4,593,205 | 6/1986 | Bass et al. | 307/608 |
| 4,641,048 | 2/1987 | Pollock | 307/591 |

FOREIGN PATENT DOCUMENTS

| 0012839 | 7/1980 | European Pat. Off. | |
| 2354001 | 12/1977 | France | |
| 2519211 | 7/1983 | France | |
| 114622 | 7/1983 | Japan | 307/591 |

OTHER PUBLICATIONS

Patents Abstract of Japan, vol. 8, No. 139, (E-253) [1576], 28, Jun. 1984; & JP-A-5947842.
IEEE Journal of Solid-State Circuits, vol. SC-10, No. 6, Dec. 1975, pp. 524-529, New York, U.S.; Tsuneta Sudo et al., "A Monolithic 8pJ/2 GHz Logic Family"; p. 525, FIG. 1(b).

Primary Examiner—Stanley D. Miller
Assistant Examiner—B. P. Davis
Attorney, Agent, or Firm—Herbert L. Lerner; Laurence A. Greenberg

[57] ABSTRACT

A circuit for compensating the temperature dependence of gate propagation times includes a signal input for feeding-in an input signal; a signal output for issuing an output signal; a multiplexer having an output connected to the signal output and three inputs; a delay gate connected between one of the inputs of the multiplexer and the signal input, another of the inputs of the multiplexer being directly connected to the signal input; and a control input connected to a further one of the inputs of the multiplexer for controlling the multiplexer in dependence on temperature and feeding the input signal to the signal output delayed in a lower temperature range, undelayed in an upper temperature range and mixed, delayed as well as undelayed in a temperature range therebetween.

16 Claims, 2 Drawing Sheets

CIRCUIT FOR COMPENSATING THE TEMPERATURE DEPENDENCE OF GATE TRANSIT TIMES

The invention relates to a circuit for compensating the temperature dependence of gate propagation times with a signal input for feeding-in an input signal, a signal output, a delay gate and a multiplexer.

Signal propagation times in integrated circuits have a positive temperature dependence, i.e., the propagation times increase due to the increase of the chip temperature as the temperature increases. This property relates to all functional elements of an integrated circuit such as gates, amplifiers and flipflops. The positive temperature dependences are caused by the positive temperature dependencies of the conductor resistances, the barrier layer capacities with the increase of the R-C time constants resulting therefrom and the transit time. The increase in the propagation time per gate is about 0.2%/K in the lower temperature range between about 0° and 70° C., and increases to about 0.5%/K at above 100° C.

Circuits are therefore customarily constructed in such a way that phase dependencies and propagation time differences of signals are still tolerable. As an alternative, the signal paths with additional gates are adapted in such a manner that the same propagation times and the same phase denendencies occur. A compensation of the positive temperature dependence cannot be performed in this way.

Furthermore, as will be described in more detail below, in decision module circuits, the use of additional gates connected in series with the data input of the decision flipflop with the same propagation time and the same temperature behavior as the circuits required for the recovery and processing of the clock frequency have the disadvantage of requiring a large amount of technical means.

It is accordingly an object of the invention to provide a circuit with negative temperature dependence for compensating the temperature dependence of gate propagation times, which overcomes the hereinafore-mentioned disadvantages of the heretofore-known devices of this general type.

With the foregoing and other objects in view there is provided, in accordance with the invention, a circuit for compensating the temperature dependence of gate propagation times, comprising a signal input for feeding-in an input signal; a signal output for issuing an output signal; a multiplexer having an output connected to the signal output and three inputs; a delay gate connected between one of the inputs of the multiplexer and the signal input, another of the inputs of the multiplexer being directly connected to the signal input; and a control input connected to a further one of the inputs of the multiplexer for controlling the multiplexer in dependence on or as a function of temperature and feeding the input signal to the signal output delayed in a lower temperature range, undelayed in an upper temperature range and mixed, delayed as well as undelayed in a temperature range therebetween.

In accordance with another feature of the invention, the temperature-controlled multiplexer is formed of two differential amplifiers having output circuits interconnected in parallel, and a further differential amplifier stage having output circuits each being connected to a respective one of the two first-mentioned differential amplifiers, the inputs of which are each controlled by a voltage of a voltage source with opposite temperature dependence.

In accordance with a further feature of the invention, there is provided a resistor and a diode controlling the inputs of the further differential amplifier stage.

In accordance with an added feature of the invention, there is provided a first series circuit of a resistor and a current source having a first junction point therebetween, a second series circuit of a diode and a current source having a second junction point therebetween, the series circuits being connected in parallel to the voltage source and the inputs of the further differential amplifier stage each being connected to a respective one of the junction points.

In accordance with an additional feature of the invention, there is provided a current source, the differential amplifiers and the further differential amplifier stage having emitters and collectors, the emitters of each of the differential amplifiers being coupled together and connected into collector circuits of the further differential amplifier stage, and the emitters of the further differential amplifier stage being connected to each other and to the current source.

In accordance with yet another feature of the invention, one of the emitters of the further differential amplifier stage is directly connected to the current source, and including a resistor connected between another of the emitters of the further differential amplifier stage and the current source.

In accordance with yet an added feture of the invention, the delay gate is formed of an additional differential amplifier having output circuits and load resistors in the output circuits.

In accordance with yet an additional feature of the invention, the delay gate is formed of an additional differential amplifier having inputs, outputs and output circuits with load resistors in the output circuits; and further differential amplifier stage includes a first transistor controlled by the diode of the second series circuit and having an output circuit connected to one of the differential amplifiers, a second transistor controlled by the resistor of the first series circuit and having an output circuit connected to another of the differential amplifiers; complementary signal inputs connected to the inputs of the additional differential amplifier and to the one differential amplifier; and the outputs of the additional differential amplifier being controlled by the other of the differential amplifiers.

In accordance with still another feature of the invention, the two differential amplifiers have outputs forming the signal outputs in a complementary manner.

In accordance with a concomitant feature of the invention, the temperature-controlled multiplexer is formed by series-gating gates in emitter-coupled logic, the gates being matched potential-wise through diodes.

Other features which are considered as characteristic for the invention are set forth in the appended claims.

Although the invention is illustrated and described herein as embodied in a circuit for compensating the temperature dependence of gate transit times, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
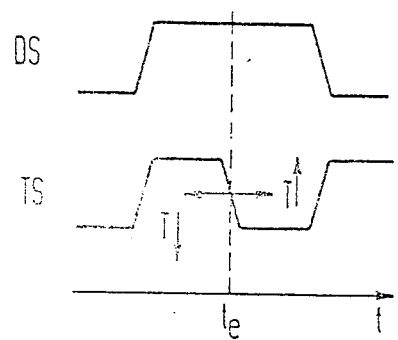
FIG. 1 is a graph of a data signal and a clock signal plotted against time.

Referring now to the figures of the drawings in detail and first, particularly, to FIG. 1 thereof, there are seen signal diagrams illustrating the temnerature influence on a timing decision to be made by a clock signal using a decision module as an example. The clock frequency is recovered through internal and external circuits from the data signal at the data input of the decision module. The clock frequency is processed through the clock recovery, filters and amplifiers and is fed to the clock input of a decision flipflop. A data signal DS is present at the data input of the decision flipflop. Each of the internal and external circuits for the clock recovery has a positive temperature dependence. The larger the temperature dependence of the clock signal path from the data input of the decision module to the clock input of the decision flipflop, the more the decision instant changes relative to the fixed data signal. If, according to FIG. 1, a decision instant te is given by the falling edge or flank of a clock signal TS, this instant is shifted to earlier points in time at lower temperatures according to the higher propagation times, while it is shifted at higher temperatures to later points in time due to the longer propagation time of the recovered clock signal TS.

Additional gates connected in series with the data input of the decision flipflop with the same propagation time and the same temperature behavior as the circuits required for the recovery and processing of the clock frequency have the disadvantage of requiring a large amount of technical means.

Figure 2:
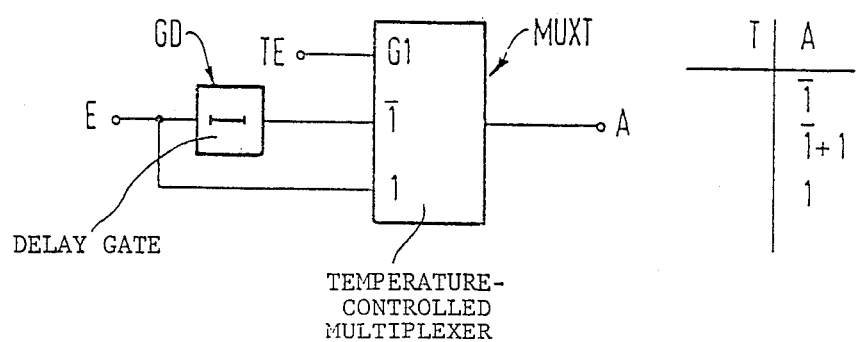
FIG. 2 is a block circuit diagram of a circuit according to the invention and a function table.

According to FIG. 2, the circuit according to the invention includes a temperature-controlled multiplexer MUXT and a delay gate GD. The temperature-controlled multiplexer MUXT is controlled through a temperature signal at a control input TE. The signal to be processed is applied to a signal input E of the circuit which is connected directly to an input of the multiplexer corresponding to a logical 1 of the control input TE and the signal to be processed is fed through the delay gate DG to an input corresponding to a logical 0 of the control input TE of the temperature-controlled multiplexer MUXT. An output A of the circuit according to the invention forms the output of the multiplexer.

According to the invention, the signal to be processed is divided and is fed in a delayed as well as in an undelayed manner to the inputs of the temperature-controlled multiplexer MUXT. On one hand, the multiplexer works in such a way that at low temperatures, the propagation time is artificially delayed and the delayed signal is switched to the output. On the other hand, at high temperatures, the undelayed signal is switched to the output. In the transition range or in the central temperature range, the delayed signal is mixed with the undelayed signal and connected to the output A. This mode of operation is shown by the function or table in FIG. 2 which gives the input of the multiplexer MUXT connected to the output A as a function of the temperature.

The switching of the temperature-controlled multiplexer MUXT is linearized in such a manner that it takes place over the entire operating temperature range. Since the transition range, in which the undelayed and the delayed signal are mixed also lies in this range, only sinusoidal signals can be processed below 500 MHz, compared to pulses above this frequency. Thus, the negative temperature dependence is obtained by the provision that at normally high gate propagation velocities, the delayed signal is fed to the output A of the multiplexer MUXT and at higher gate propagation times the undelayed signal is fed thereto. In the device shown in FIG. 1, a circuit according to the invention can therefore lie in the clock frequency path for the recovery and processing of the clock frequency.

Figure 3:
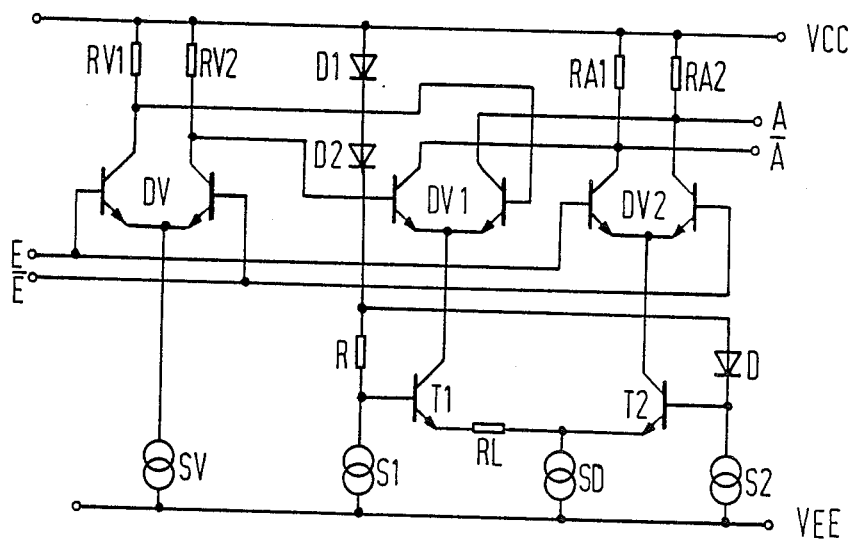
FIG. 3 is a schematic circuit diagram of a specific embodiment of a circuit according to FIG. 2.

FIG. 3 shows a specific embodiment of a circuit according to FIG. 2. The circuit is constructed in ECL technology and is connected to poles VCC and VEE of a supply voltage source. The signal to be processed is present in complementary inverted and non-inverted form at signal input E and $\overline{E}$. The two signal inputs are connected in parallel to the inputs of two differential amplifiers DV and DV2. The collectors of the transistors forming the differential amplifier DV are connected to the positive pole VCC of the supply voltage source through two load resistors RV1 and RV2. The two outputs of the differential amplifier DV are connected to the inputs of a following differential amplifier DV1.

The outputs of the two respective differential amplifiers DV1 and DV2 are connected in parallel through two load resistors RA1 and RA2 to the positive pole VCC of the supply voltage source. In this way, the collectors of the transistors of the differential amplifiers DV1 and DV2 associated with the inverted signal inputs are connected with the load resistor RA2 and form the signal output A, while the collectors of the respectively associated transistors of the differential amplifiers DV1 and DV2 are connected to the load resistor RA1 and form the inverted signal output $\overline{A}$. The transistor of the differential amplifier DV1 connected to the non-inverting output A is controlled by the output of the transistor of the differential amplifier DV connected to the non-inverting signal input E.

The emitters of the transistors of the three differential amplifiers DV, DV1 and DV2 are directly connected to each other. The emitters of the differential amplifier DV are connected through a current source SV to the negative pole VEE of the supply voltage source. The emitters of the differential amplifier DV1 are connected to the collector of a transistor T1 and the emitters of the differential amplifier DV2 are connected to the collector of a transistor T2. The two transistors T1 and T2 form a further differential amplifier, the emitters of which are connected to the negative pole VEE of the supply voltage source through a current source SD. According to FIG. 3, a resistor RL is connected between the emitter of the transistor T1 and the current source SD.

A series circuit formed of two diodes D1 and D2, a resistor R and a current source S1 is connected between the poles VCC and VEE of the supply voltage source. The base of the transistor T1 is connected to the junction point between the resistor R and the current source S1. A series circuit of a diode D and a current source S2 leads from the junction point between the resistor R and the diode D2 to the pole VEE of the supply voltage source. The base of the transistor T2 is connected to the junction point between the diode D and the current source S2. The current sources SV, S1, S2 and SD are customarily formed by the output circuits of transistors with or without an emitter resistor, the bases of which are controlled by a voltage, preferably a common base voltage.

The gate formed by the differential amplifier DV serves for delaying the signal. The change of the delay time can be accomplished by means of the load resistors RV1 and RV2. The delayed signal arrives at the input of the differential amplifier DV1 which forms an AND gate with the transistor T1. Besides arriving at the delay gate, the undelayed signal also arrives at the differential amplifier DV2 which represents an AND gate along with the transistor T2. Both AND gates are constructed with series gating and are connected to the output through an OR logic in the form of the respective parallel circuit of the outputs.

The thermal switch-over of the multiplexer is accomplished by the opposite voltage temperature dependence of the resistor R and the diode D. At low temperatures, the voltage drop across the resistor R is small and the threshold voltage for the diode is relatively large, so that the transistor T1 substantially conducts and therefore the delayed signal is switched to the output A or Ā. Due to the positive temperature coefficient of the resistor R, the voltage drop across the resistor becomes larger as the temperature increases, while at the same time the threshold voltage of the diode D drops due to its negative temperature coefficient. Switching therefore takes place increasingly from the transistor T1 to the transistor T2 and the undelayed input signal is fed to the output through the differential amplifier DV2. The transistion characteristic for the switching range is linearized in this case by means of the resistor RL, so that a temperature range as large as possible is obtained for switching over.

The diodes D1 and D2 serve for adapting the voltage level of the series-gating stage formed by the transistors T1 and T2 to the higher potential series-gating stage represented by the differential amplifiers DV, DV1 and DV2.

The foregoing is a description corresponding in substance to German Application Pat. No. 35 34 561.6, dated Sept. 27, 1985, the International priority of which is being claimed for the instant application, and which is hereby made part of this application. Any material discrepancies between the foregoing specification and the aforementioned corresponding German application are to be resolved in favor of the latter.

We claim:

1. Circuit for compensating the temperature dependence of gate propagation times, comprising a signal input for feeding-in an input signal; a signal output for issuing an output signal; a temperature-controlled multiplexer having an output connected to said signal output and three inputs; a delay gate connected between a first one of said inputs of said multiplexer and said signal input, another of said inputs of said multiplexer being directly connected to said signal input; and a further input being a control input of said multiplexer for controlling said multiplexer in dependence on temperature and feeding the input signal to said signal output delayed in a lower temperature range, undelayed in an upper temperature range and mixed, delayed as well as undelayed in a temperature range therebetween.

2. Circuit according to claim 1, wherein said temperature-controlled multiplexer is formed of two differential amplifiers having their respective output circuits connected in parallel with said signal output, and a further differential amplifier stage having output circuits each being connected to a respective one of said two first-mentioned differential amplifiers, the inputs of said further differential stage is controlled by a voltage of a voltage source with opposite temperature dependence.

3. Circuit according to claim 2, including a resistor and a diode controlling the inputs of said further differential amplifier stage.

4. Circuit according to claim 2, including a first series circuit of a resistor and a current source having a first junction point therebetween, a second series circuit of a diode and a current source having a second junction point therebetween, said series circuits being connected in parallel to said voltage source and the inputs of said further differential amplifier stage each being connected to a respective one of said junction points.

5. Circuit according to claim 2, including a current source, said differential amplifiers and said further differential amplifier stage having emitters and collectors, said emitters of each of said differential amplifiers being coupled together and connected into collector circuits of said further differential amplifier stage, and said emitters of said further differential amplifier stage being connected to each other and to said current source. further differential amplifier stage and said current source.

6. Circuit according to claim 2, wherein said delay gate is formed of an additional differential amplifier having output circuits and load resistors in said output circuits.

7. Circuit according to claim 2, wherein said two differential amplifiers have outputs forming said signal outputs in a complementary manner.

8. Circuit according to claim 1, wherein said temperature-controlled multiplexer is formed by series-gating gates in emitter-coupled logic, said gates being matched potential-wise through diodes.

9. Circuit for compensating the temperature dependence of gate propagation times, comprising a signal input for feeding-in an input signal; as signal output for issuing an output signal; a temperature-controlled multiplexer having an output connected to said signal output and three inputs; a delay gate connected between a first one of said inputs of said multiplexer and said signal input, another of said inputs of said multiplexer being directly connected to said signal input; and a further input being a control input of said multiplexer for controlling said multiplexer in dependence on temperature and feeding the input signal to said signal output delayed in a lower temperature range, undelayed in an upper temperature range and mixed, delayed as well as undelayed in a temperature range therebetween; wherein said temperature-controlled multiplexer is formed of two differential amplifiers having their respective output circuits connected in parallel with said signal output; including a further differential amplifier stage having output circuits each being connected to a respective one of said two first-mentioned differential amplifiers, the inputs of said further differential stage being controlled by a voltage of a voltage source with opposite temperature dependence, including a resistor and a diode controlling the inputs of said further differential amplifier stage.

10. Circuit for compensating the temperature dependence of gate propagation times, comprising a signal input for feeding-in an input signal; a signal output for issuing an output signal; a temperature-controlled multiplexer having an output connected to said signal output and three inputs; a delay gate connected between a first one of said inputs of said multiplexer and said signal input, another of said inputs of said multiplexer being directly connected to said signal input; and a further input being a control input of said multiplexer for controlling said multiplexer in dependence on temperature and feeding the input signal to said signal output delayed in a lower temperature range, undelayed in an upper temperature range and mixed, delayed as well as undelayed in a temperature range therebetween; wherein said temperature-controlled multiplexer is formed of two differential amplifiers having their respective output circuits connected in parallel with said signal output; including a further differential amplifier stage having output circuits each being connected to a respective one of said two first-mentioned differential amplifiers, the inputs of said further differential stage being controlled by a voltage of a voltage source with opposite temperature; and including a first series circuit of a resistor and a current source having a first junction point therebetween, a second series circuit of a diode and a current source having a second junction point therebetween, said series circuits being connected in parallel to said voltage source and the inputs of said further differential amplifier stage each being connected to a respective one of said junction points.

11. Circuit according to claim 10, wherein said delay gate is formed of an additional differential amplifier having inputs, outputs and output circuits with load resistors in said output circuits; said further differential amplifier stage includes a first transistor controlled by said diode of said second series circuit and having an output circuit connected to one of said differential amplifiers, a second transistor controlled by said resistor of said first series circuit and having an output circuit connected to another of said differential amplifiers; complementary signal inputs connected to said inputs of said additional differential amplifier and to said one differential amplifier; and said outputs of said additional differential amplifier being controlled by said other of said differential amplifiers.

12. Circuit for compensating the temperature dependence of gate propagation times, comprising a signal input for feeding-in an an input signal; a signal output for issuing an output signal; a temperature-controlled multiplexer having an output connected to said signal output and three inputs; a delay gate connected between a first one of said inputs of said multiplexer and said signal input, another of said inputs of said multiplexer being directly connected to said signal input; and a further input being a control input of said multiplexer for controlling said multiplexer in dependence on temperature and feeding the input signal to said signal output delayed in a lower temperature range, undelayed in an upper temperature range and mixed, delayed as well as undelayed in a temperature range therebetween; wherein said temperature-controlled multiplexer is formed of two differential amplifiers having their respective output circuits connected in parallel with said signal output; including a further differential amplifier stage having output circuits each being connected to a respective one of said two first-mentioned differential amplifiers, the inputs of said further differential stage being controlled by a voltage of a voltage source with opposite temperature dependence; and including a current source, said differential amplifiers and said further differential amplifier stage having emitters and collectors, said emitters of each of said differential amplifiers being coupled together and connected into collector circuits of said further differential amplifier stage, and said emitters of said further differential amplifier 13. Circuit according to claim 12. wherein one of said emitters of said further differential amplifier stage is directly connected to said current source, and including a resistor connected between another of said emitters of said further differential amplifier stage and said current source.

14. Circuit for compensating the temperature dependence of gate propagation times, comprising a signal input for feeding-in an input signal; a signal output for issuing an output signal; a temperature-controlled multiplexer having an output connected to said signal output and three inputs; a delay gate connected between a first one of said inputs of said multiplexer and said signal input, another of said inputs of said multiplexer being directly connected to said signal input; and a further input being a control input of said multiplexer for controlling said multiplexer in dependence on temperature and feeding the input signal to said signal output delayed in a lower temperature range, undelayed in an upper temperature range and mixed, delayed as well as undelayed in a temperature range therebetween; wherein said temperature-controlled multiplexer is formed of two differential amplifiers having their respective output circuits-connected in parallel with said signal output: including a further differential amplifier stage having output circuits each being connected to a respective one of said two first-mentioned differential amplifiers, the inputs of said further differential stage being controlled by a voltage of a voltage source with opposite temperature dependence; and wherein said delay gate is formed of an additional differential amplifier having output circuits and load resistors in said output circuits.

15. Circuit for compensating the temperature dependence of gate propagation times, comprising a signal input for feeding-in an input signal; a signal output for issuing an output signal; a temperature-controlled multiplexer having an output connected to said signal output and three inputs; a delay gate connected between a first one of said inputs of said multiplexer and said signal input, another of said inputs of said multiplexer being directly connected to said signal input; and a further input being a control input of said multiplexer for controlling said multiplexer in dependence on temperature and feeding the input signal to said signal output delayed in a lower temperature range, undelayed in an upper temperature range and mixed, delayed as well as undelayed in a temperature range therebetween; wherein said temperature-controlled multiplexer is formed of two differential amplifiers having their respective output circuits connected in parallel with said signal output; including a further differential amplifier stage having output circuits each being connected to a respective one of said two first-mentioned differential amplifiers, the inputs of said further differential stage being controlled by a voltage of a voltage source with opposite temperature dependence; and wherein said two differential amplifiers have outputs forming said signal outputs in a complementary manner.

16. Circuit for compensating the temperature dependence of gate propagation times, comprising a signal input for feeding-in an input signal; a signal output for issuing an output signal; a temperature-controlled multiplexer having an output connected to said signal output and three inputs; a delay gate connected between a first one of said inputs of said multiplexer and said signal input, another of said inputs of said multiplexer being directly connected to said signal input; and a further input being a control input of said multiplexer for controlling said multiplexer in dependence on temperature and feeding the input signal to said signal output delayed in a lower temperature range, undelayed in an upper temperature range and mixed, delayed as well as undelayed in a temperature range therebetween; wherein said temperature-controlled multiplexer is formed by series-gating gates in emitter-coupled logic, said gates being matched potential-wise through diodes.

* * * * *